United States Patent [19]

Tuppen et al.

[11] Patent Number: 5,279,687
[45] Date of Patent: Jan. 18, 1994

[54] PREPARING SUBSTRATES BY ANNEALING EPITAXIAL LAYERS IN THE FORM OF NESAS AND SUBSTRATES SO PREPARED

[75] Inventors: Christopher G. Tuppen, Colchester; Christopher J. Gibbings, Ipswich, both of England

[73] Assignee: British Telecommunications PLC, London, England

[21] Appl. No.: 761,893

[22] PCT Filed: Feb. 27, 1990

[86] PCT No.: PCT/GB90/00305
§ 371 Date: Sep. 12, 1991
§ 102(e) Date: Sep. 12, 1991

[87] PCT Pub. No.: WO90/10950
PCT Pub. Date: Sep. 20, 1990

[30] Foreign Application Priority Data

Mar. 10, 1989 [GB] United Kingdom ............... 8905511

[51] Int. Cl.$^5$ .................. H01L 21/324; H01L 29/161
[52] U.S. Cl. ........................ 148/33.2; 148/DIG. 97; 437/82; 437/126; 437/128; 437/939; 437/247
[58] Field of Search ............... 437/82, 126, 128, 939, 437/969, 247; 148/DIG. DIG. 3, DIG. 72; 357/16, 20, 56, 90

[56] References Cited

U.S. PATENT DOCUMENTS

| | | | |
|---|---|---|---|
| 3,890,170 | 6/1975 | Russ | 437/128 |
| 4,529,455 | 7/1985 | Bean et al. | 148/175 |
| 4,696,095 | 9/1987 | Thomas | 437/78 |
| 4,952,527 | 8/1990 | Calawa et al. | 437/82 |

FOREIGN PATENT DOCUMENTS

| | | |
|---|---|---|
| 0002658 | 7/1979 | European Pat. Off. . |
| 0232082 | 8/1987 | European Pat. Off. . |
| 2227050 | 11/1974 | France . |
| WO87/06392 | 10/1987 | World Int. Prop. O. . |

OTHER PUBLICATIONS

Asai et al: "Heteroepitaxial growth of Ge films on the Si(100)-2X1 surface" p. 257702583, Journal of Applied Physics, vol. 58, No. 97, Oct. 1985.
*Applied Physics Letters*, vol. 44, No. 12, 15 Jun. 1984, pp. 1149-1151, American Institute of Physics, New York, US; W. I. Wang: "Molecular beam epitaxial growth and material properties of GaAs and AlGaAs on Si(100)".
*Journal of Vacuum Science & Technology/B*, vol. 3, No. 2, Mar./Apr. 1985, p. 603, American Vacuum Society, Woodbury, N.Y., US; P. N. Uppal et al: "Summary abstract: MBE growth of GaAs and GaP on Si(211)".
*Journal of Vacuum Science & Technology/A*, vol. 4, No. 3, part 1, May/Jun. 1986, pp. 894-896, American Vacuum Society, Woodbury, N.Y., US; J. M. Seo et al: "Growth and surface structure of Ge-Si alloy films on Si(111)-(7×7)".

*Primary Examiner*—George Fourson
*Attorney, Agent, or Firm*—Nixon & Vanderhye

[57] ABSTRACT

In order to grow single crystal, solid state devices onto a mismatched substrate, a secondary substrate is obtained by growing an epilayer divided into mesas (21) onto the primary substrate. The epilayer is annealed and this relieves the strain and causes dislocations to terminate preferentially on the sides of the mesas.

20 Claims, 1 Drawing Sheet

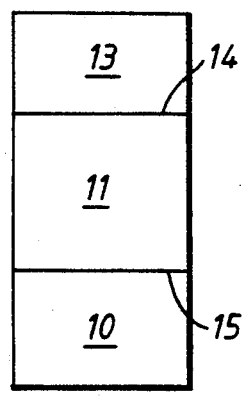 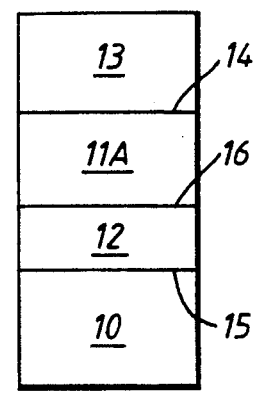
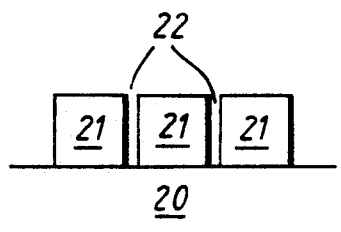 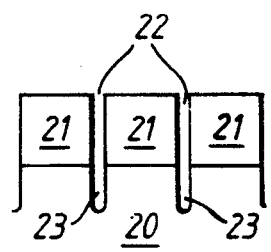
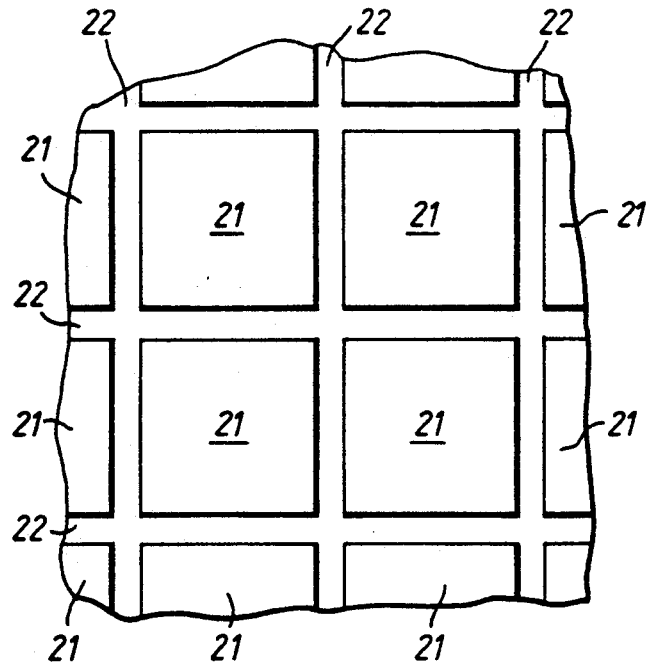 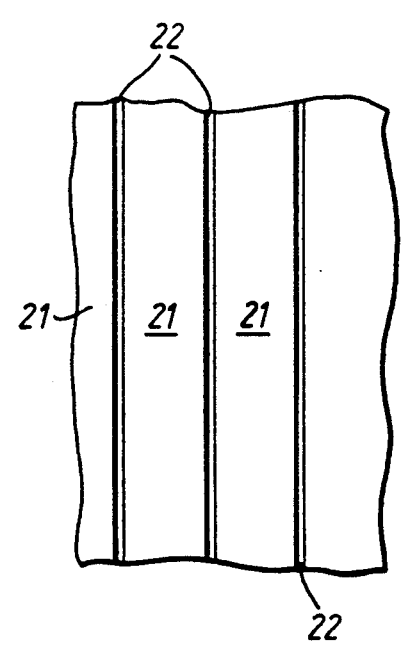

PREPARING SUBSTRATES BY ANNEALING EPITAXIAL LAYERS IN THE FORM OF NESAS AND SUBSTRATES SO PREPARED

This invention relates to the preparation of substrates used as the starting point for epitaxial growth.

Many varieties of semiconductor devices are produced by depositing one or more single crystal layers onto a substrate. The processes used for the deposition, e.g. molecular beam epitaxy (MBE) and metal organic vapour phase epitaxy (MOVPE), can be adapted to produce a wide range of chemical compositions. However it is necessary to start such process from a primary substrate and the range of primary substrates is very limited because the crystallisation techniques used to prepare them are suitable only for a limited range of pure compounds and elements. It should be appreciated that the size of the unit crystallographic cell of the deposited layer is dependent on the chemical composition and it may not be possible to obtain a primary substrate, e.g. a Czochralski wafer, which has the same cell dimensions.

As an example, the use of alloys of Si/Ge as semiconductors would increase the range of operational properties for high speed circuits but it is not feasible to make Czochralski wafers out of Si/Ge alloys. Thus it is necessary to grow the alloy onto pure Si in which case the unit cell sizes do not match. Another example, selected from a different chemical system, concerns semiconductors based on In, Ga, As, P. The available primary substrates are InP, InAs, GaP and GaAs. In device structures ternary or quaternary layers are usually chosen so that the cell size matches that of the primary substrate. The designer's freedom of choice would be increased if it were possible to reduce the adverse effects of mismatch.

Other reasons for mis-matched cell sizes also exist. For example, it would be convenient to grow ternary or quaternary compounds of In, Ga, P and As onto silicon because the Si is stronger and cheaper than InP. In addition, Si has a higher thermal conductivity than InP. This would be advantageous for integrated devices including, for example, lasers and transistors. In this case the choice of substrate is based upon physical and chemical properties rather than availability but the same epitaxial problem is encountered, namely that the primary substrate does not have the same cell size as the intended epilayers.

The problems caused by growing onto a mis-matched primary substrate will now be explained. If only one or two layers of atoms are deposited, then the epilayer will elastically distort so that its "in-plane" lattice constant matches the lattice constant of the primary substrate. If the epilayer experiences biaxial compression in the substrate plane then its dimension normal to that plane will be increased. As the epilayer is much thinner than the primary substrate, the primary substrate will retain its normal structure and all the strain will be imposed on the epilayer.

The strain in the epilayer represents stored energy which causes instability. More specifically there is an equilibrium critical thickness. Below this thickness the strain energy is insufficient to cause dislocations and the epilayer will remain in a stable strained state; above the equilibrium critical thickness it would be advantageous for the structure to dislocate. However, in most cases the activation energy of dislocation is high and there is a metastable critical thickness. Below this metastable thickness the strain energy is insufficient to provide the activation energy and, therefore, the system is metastable. Above the metastable critical thickness there is enough strain energy to cause the structure to dislocate. Since most useful devices are thicker than the metastable critical thickness it will dislocate.

The misfit dislocations which form when a layer relaxes are generally in the form of dislocation half loops comprising an interfacial component and two arms that thread up through the whole volume of the epitaxial layer to the surface. Clearly the density of interfacial disclocations depends on the degree of mismatch. If the match were perfect there would be no dislocations. If the linear dimensions in the epitaxial plane differ by 1% there will be about 100 atoms between the dislocations. The density of threading dislocations depends on a number of complex and interrelated factors such as dislocation glide velocity, elasticity constants, dislocation interactions etc. It generally lies in the range $10^6$–$10^{10}$ cm$^{-2}$, giving an average distance of 0.1–10 $\mu$m between threading dislocations. It will be appreciated that the threading dislocations are so close that any device would almost certainly be affected by a dislocation if the device were deposited onto a mis-matched primary substrate. A threading dislocation reduces the performance of an affected device and usually the performance is reduced to a level at which the device is non-functional. For this reason it is usually considered necessary to match the cell size of the epilayers to the cell size of the primary substrate and this leads to the restrictions mentioned above. It is an object of this invention to make practical the use of a mis-matched primary substrate.

According to this invention, a substrate for epitaxial growth is prepared by annealing a secondary substrate comprising a primary substrate, e.g. a Czochralski wafer, and a mismatched epilayer which is divided into a plurality of mesas, wherein said annealing relieves the strain created by the mismatch so that the dislocations preferentially terminate on the sides of the mesas. In the preferred embodiments no dislocations terminate on the surface of the mesas.

The annealing is an important feature of this invention because the strain is relieved during this step. During annealing there is no growth, i.e. the annealing atmosphere may contain some reactants but insufficient reactants to support a deposition reaction. This controls the dislocations such that their effect on the subsequently deposited layers is minimised. The following features help to relieve the strain, preferably all the strain, during annealing:

(a) The epilayer should be meta stable before annealing, i.e. its thickness should be greater than the critical equilibrium thickness but less than the meta stable critical thickness at growth temperature.

(b) The annealing temperature should be higher than the growth temperature, e.g. 200° C. higher, preferably between 50°–400° higher, and more preferably between 100°–400° higher.

(c) The time needed is about 5–600 minutes, typically 5–60 minutes, e.g. about 10–20 minutes. Clearly the time must be long enough substantially to relieve all the strain but excessive times are undesirable because of the risk of thermal degradation. If appropriate, the annealing should be carried out in the presence of reagents to suppress degradation reactions, e.g. a substrate containing In and P should be annealed in the presence of PH$_3$. By way of guidance some typical growth temperatures are provided:

| Si/Ge | by MBE | $T_g$ = 450–600° C. |
|---|---|---|
| Si/Ge | by CVD | $T_g$ = 600–750° C. |
| III/V's | by MBE | $T_g$ = 500–750° C. |
| III/V's | by MOCVD | $T_g$ = 600–800° C. |

The secondary substrates prepared by this method are used, after annealing, for conventional epitaxial growth. The epilayer of the secondary substrate is chosen so that, at least on its exposed surface, the cell size matches that of the intended device. Preferably the surface of the epilayer of the secondary substrate is chemically and crystallographically identical to the first layer of the intended device. Thus the device is effectively grown onto a matched substrate and this causes no extra dislocations. The annealing of the secondary substrate relieves the strain in its epilayer in such a manner that relatively few, and ideally none, of the dislocations terminate on the surface of the mesas. As the surface of the secondary substrate is now lattice matched to the intended new layers, the further growth does not introduce further dislocations and the functional properties of the grown device are improved, e.g. the rate of failure is reduced.

In operating this invention the conventional practice of growing many devices onto one wafer is adopted. After growth the wafer is divided into the separate devices. It is desirable to select the size of the mesas to correspond to the individual devices. It is also desirable that the mesas are kept as small as possible because this favours the termination of the dislocations on the side of the mesas. When the substrate is divided, it is necessary to divide the final product along the lines where the secondary substrate was divided into mesas but it is also possible to subdivide the mesas even further. However, the smaller the mesas the less chance of a dislocation terminating on the epitaxial surface and, therefore, it is desirable to avoid subdividing the mesas after the operative layers are grown.

It was stated above that the surface of the epilayer is preferably identical, chemically and crystographically, to the first layer of the intended device. There are two preferred embodiments, i.e. mono epilayers and twin epilayers. These two embodiments will now be described.

A mono epilayer has the same chemical composition throughout. This is preferably the same as the composition of the first layer of the device. A mono layer introduces a substantial discontinuity of chemical composition at the interface between the primary substrate and the growth layer. When the secondary substrate is annealed major disclocations will occur close to the interface.

A twin epilayer comprises two regions, namely an outer region and a graded region which is located between the primary substrate and the outer region. The outer region has a uniform chemical composition which is preferably the same as the chemical composition of the first layer of the device. In the graded region the chemical composition varies, e.g. uniformly, through its thickness. Adjacent to the primary substrate the composition of the graded region is the same as that of the primary substrate. Adjacent to the outer region it has the same chemical composition as the outer region. The graded region is grown before the outer region and, during its growth, the composition of the reactants is changed to produce the grading. A twin epilayer is designed to cause no abrupt discontinuities and strain is more evenly distributed than with a mono epilayer.

The divisions between the mesas may be produced by conventional epitaxial techniques, e.g. by depositing growth-inhibiting masks at the locations of the intended channels whereby growth occurs only in the windows between the channels so as to produce the mesas. This technique, which is particularly suitable for use with the twin epilayers mentioned above, fits conveniently into standard growth schedules. Thus, after the masks have been applied, the primary substrate is introduced into the growth chamber and an epilayer is deposited to form the secondary substrate. The growth of the secondary substrate is terminated, e.g., by switching off some or all of the reactants, and the temperature raised to anneal the epilayer. When the annealing is completed, the temperature is reduced to reaction temperature and the supply of reagents to grow the device layers is initiated.

Alternatively, the whole of the epilayer is grown and the complete layer is mechanically divided as by sawing or scribing, to produce the channels. This division is preferably continued not only through the whole of the epilayer but into the primary substrate. The annealing takes place after the division. This technique requires a break in the growth because the secondary substrate must be removed from the growth chamber for division. Annealing and subsequent growth takes place continuously.

In a special embodiment all the channels are parallel to one another and all extend in a <110> direction in the epitaxial plane. The spacing between the channels should be about 2–5 mm. Because all the channels are parallel they all extend in the same <110> direction. When the substrate is annealed the strain in only relieved in one crystallographic direction, i.e. the one parallel to the channels.

This gives rise to products which are novel per se. These products, which are part of the invention, are strained in one crystallographic direction and strain free in at least one other crystallographic direction. For example, the device is strained in a first direction in the epitaxial plane, and strain free in a second direction in the epitaxial plane.

The invention will now be described by way of example with reference to the accompanying drawings in which:

BRIEF DESCRIPTION OF THE DRAWINGS

FIGS. 1 and 2 are cross sections through complete devices according to the invention;

FIGS. 3A and 3B are cross sections through secondary substrates according to the invention; and FIGS. 4 and 5 are plan views of secondary substrates according to the invention.

FIG. 1 shows a device having a secondary substrate comprising a primary substrate 10 having a cell size different from that of the device per se 13. An epilayer, consisting of a mono region 11, is located between the device per se 13 and the primary substrate 10. The mono region 11 forms an interface 14 with the device per se 13 and an interface 15 with the primary substrate 10. The device per se 13 comprises a plurality of layers which are not shown individually because the structure of the device 13 is conventional.

The mono region 11 is first deposited on to the substrate 10. As the unit cell of the monolayer is different to that of the substrate the monolayer is at first strained. During a high temperature anneal the strain in the mono region is relieved by the formation of misfit dislocations at interface 15. The composition of the mono region is chosen such that, following the anneal, its unit cell dimension is the same as the average unit cell dimension of the device 13. The mesa structure will reduce the number of threading dislocations that propagate up through the mono region 11 and into the device 13. The inclusion of the mono region 11 does not guarantee that all the devices will be satisfactory but it reduces the proportion of failures (which must be rejected on testing).

FIG. 2 shows an alternative preferred embodiment wherein the mono region 11 is replaced by twin regions 11A and 12. In this version, outer region 11A is similar to region 11 of FIG. 1 in that it has the same crystallographic dimensions as the device 13. Graded region 12, which is located between the primary substrate 10, and the outer region 11A, forms an interface 15 with the primary substrate 10 and an interface 16 with the outer region 11A. Conveniently the chemical composition of the graded region 12 varies uniformly through its thickness or a series of steps may be used. Adjacent to interface 15, the graded region 12 has the same chemical composition as the primary substrate 10 but near interface 16 its chemical composition is the same as that of the outer region 11A.

The stored energy, which is the result of the strain, progressively increases from the interface 15 to the interface 16. The annealing encourages dislocation and it can be shown that the first dislocations occur close to the interface 15. As the annealing proceeds more dislocations occur, in time sequence, at progressively higher levels. In other words the dislocations occur at different times and at different locations.

It can also be shown that the annealing causes threading dislocations to travel through the mesa. Unless some undesired mechanism stops the motion they will travel until they reach the edge, where they cause no adverse effects. The accidental intersection of two threading dislocations is one mechanism for terminating this progress. It will be appreciated that different starting times and places reduces the probability of an intersection and, therefore, the use of a graded layer helps to reduce the proportion of faulty devices.

FIG. 3A shows a cross section through a secondary substrate (before the growth of the device layers is started). The secondary substrate comprises a primary substrate 20, eg a Czochralski wafer, with epitaxial mesas 21 grown thereon. The mesas 21 are separated by channels 22 which extend to the surface of the primary substrate 20.

FIG. 3B is a variant of FIG. 3A when the channels 22 are produced by cutting, eg with a saw, through a continuous layer of growth. In this case the cuts extend slightly below the surface of the primary substrate so that the base of each channel 22 is formed by a groove 23 in the surface of the primary substrate 20.

Typical thicknesses are as follows:

|  | Narrow range | Wide range |
| --- | --- | --- |
| Primary substrate | 0.1–2 mm | 0.1–2 mm |
| Height of mesa | 500–1000 nm | 0.1–10 μm |
| Mono layer 11 | 500–1000 nm | 0.1–10 μm |
| Graded layer 12 | 100–500 nm | 0.1–10 μm |
| Outer layer 11A | 200–1000 nm | 0.1–10 μm |
| Device | 1–5 μm | 0.1–10 μm |

N.B. The drawings are not in proportion because of the wide range of thicknesses. The thickness of the primary substrate is chosen for mechanical strength and it is much thicker, e.g. of the order 100 times thicker, than all the other layers put together. The thickness of the device is similar to that of the epitaxial substrate layer. The thickness of the outer layer 11A is usually about twice the thickness of the graded layer 12.

(The width of the channel is not critical. The channel must be wide enough to separate the mesas and any excessive width merely wastes Czochralski wafer. About 1–20 micrometers is sufficient for the width of the channels).

FIG. 4 shows one arrangement of mesas 21 on the substrate. The mesas are square in shape separated by two sets of channels 22. Preferably the channels 22 extend in <110> directions but other directions are possible. In addition the mesas need not be square.

FIG. 5 shows a different arrangement in which there is only one set of channels 22, all parallel and all extending in the same <110> direction. The spacing between the channels can be varied, but would generally be in the range 0.05–5 mm.

The configuration shown in FIG. 5 is intended to produce a semi-strained product. Relatively short times and relatively low temperatures of annealing are chosen so as to achieve this. It is preferred that the channels 22 are produced by sawing or the like to cause crystallographic damage which acts as sites for the propagation of dislocations. When the strain is relieved the lines of dislocation extend between the channels 22.

Two methods of growing substrates will now be described.

In the first method, an unmasked substrate, e.g. a Czochralski wafer, is placed in an MBE or MOVPE growth chamber and a uniform layer which is different from the primary substrate is grown. The substrate and its epilayer are removed from the growth chamber and a desired pattern of growth channels is produced, e.g. using a saw or a scribe or by etching. After cutting, the wafer is returned to the growth chamber and annealed. Finally the device layers are grown.

In a second method, the primary wafer is masked before introduction to the growth chamber. A growth inhibiting mask, e.g. an oxide for a silicon substrate, is deposited in the intended channel regions. The masked substrate corresponds to FIG. 4, having the areas 22 coated and windows 21 exposed for growth. The masked substrate is placed in a growth chamber and the growth is commenced. Initially, the growth has the same composition as the primary substrate but one or more extra reactants are introduced to modify the composition of the growth. The concentration of the extra reactants is continuously increased until a predetermined composition is achieved, i.e. graded layer 12 of FIG. 2 is grown. At this point growth is continued without changing the composition of the reactants, i.e. outer layer 11A is grown. When the secondary substrate is complete, the flow of reaction mixture is interrupted and the temperature raised for annealing to relieve the strain by causing dislocation. Finally the supply of reactants is re-established to grow the device.

We claim:

1. A method of preparing a semiconductor device, which method comprises:
   (a) growing a mismatched epilayer onto a substrate,
   (b) annealing the resulting structure, wherein said mismatched epilayer on the substrate is in the form of mesas during the annealing, and
   (c) growing a semiconductor device onto said mismatched epilayer after the epilayer has been annealed in step (b) wherein the device is matched to the surface of the annealed epilayer on the substrate but not to the substrate underlying the epilayer.

2. A method according to claim 1, wherein the mismatched epilayer is grown onto the substrate after the substrate has been masked to prevent growth between the intended mesas.

3. A method according to claim 1, wherein the mismatched epilayer is grown onto the whole surface of the substrate and then divided to produce the mesas.

4. A method according to claim 1, wherein the annealing is carried out at 50° to 400° C. above the growth temperature of the epilayer.

5. A method according to claim 1, wherein the annealing is carried out for 5 to 600 minutes.

6. A method according to claim 1, wherein the epilayer is grown by use of growth reactants and the composition of the reactants is retained constant during the growth of the epilayer, said reactants being adapted to produce a composition which is mismatched to the substrate.

7. A method of preparing a substrate for subsequent epitaxial growth of semiconductor devices, which method comprises:
   (a) preparing the substrate by growing a mismatched epilayer onto the substrate and annealing the resulting structure wherein said mismatched epilayer on the substrate is in the form of mesas during annealing, and
   (b) wherein the epilayer is grown by use of growth reactants in two stages;
   (i) at the beginning of the first stage a first composition of reactants is employed to grow a material matched to the substrate and during the course of the first stage the composition of the reactants is changed to a second composition to grow a material matched to intended device layers which are subsequently grown; and
   (ii) during the second stage the composition of the reactants is retained at the second composition whereby a layer of uniform composition is grown during the second stage.

8. A structure comprising an array of semiconductor devices grown onto a substrate suitable for use as a starting material for epitaxial growth, wherein the array comprises:
   a substrate layer and an epitaxial layer having a plurality of mesas,
   wherein at least the top surface of the epitaxial layer is mismatched to the underlying substrate layer and the epitaxial layer includes crystallographic dislocations the majority of which terminate on the sides of the mesas as a result of annealing the epitaxial layer in the form of mesas, and
   an array of semiconductor devices grown onto the annealed mesas wherein the devices are matched to the surface of the annealed epitaxial layer on the substrate but not to the substrate underlying the epitaxial layer.

9. A structure according to claim 8, wherein each mesa of the epitaxial layer includes a single region of uniform chemical composition.

10. A structure according to claim 8, wherein the epitaxial layer comprises:
    an outer layer of uniform composition which is mismatched to the substrate layer and
    a graded layer located between the outer layer and the substrate,
    the composition of the graded layer being matched (i) to the substrate layer at its interface with the substrate layer and (ii) to the outer layer at its interface with the outer layer.

11. A structure according to claim 8, wherein the mesas take the form of elongated ridges separated by a plurality of longitudinally extending parallel channels oriented in a $<110>$ direction.

12. A structure according to claim 8, wherein the mesas are square or rectangular in shape and separated by two sets of longitudinally extending grooves, wherein the members of each set are parallel to one another.

13. A semiconductor device which comprises:
    (i) a primary substrate,
    (ii) a device region crystallographically mismatched to (i), and
    (iii) an intermediate epilayer located between (i) and (ii); wherein (iii) comprises a uniform outer region adjacent to and matched to (ii) and a graded region adjacent to (i), said graded region being matched to (i) at its interface with (i) and matched to the outer region at the interface between the outer region and the graded region whereby (iii) effectively constitutes a secondary substrate which is crystallographically matched to (ii) wherein said epilayer is annealed in the form of mesas on the primary substrate prior to creation of the device region on the epilayer.

14. A semiconductor device according to claim 13, wherein (iii) contains crystallographic dislocations which do not extend into (ii).

15. A semiconductor device comprising:
    at least one epitaxial semiconductor layer located between a device layer and a substrate in which the semiconductor lattice of the epitaxial layer is, as first deposited, strained due to a built-in stress layer,
    the strain in a first crystallographic direction in the plane of the epitaxial layer being greater than the strain in a second crystallographic direction in the same plane wherein said epitaxial layer is annealed after being formed into mesas on the substrate and prior to creation of device regions on the epitaxial layer and said annealing relieves the strain.

16. A semiconductor device according to claim 15, wherein said epitaxial layer is substantially strain-free in said second crystallographic direction.

17. A method of preparing a semiconductor structure comprising a substrate and an epilayer crystallographically mismatched to said substrate; said structure being adapted for receiving material crystallographically mismatched to said substrate but crystallographically matched to said epilayer, wherein said process comprises:

(a) growing said epilayer onto the substrate by use of growth reactants in two stages:
  (i) at the beginning of the first stage a first composition of reactants is employed to grow a material matched to the substrate and during the course of the first stage the composition of the reactants is changed to a second composition to grow a material matched to intended device layers which are subsequently grown but which is mismatched to the substrate and thereby causes strain;
  (ii) during the second stage the composition of the reactants is retained at the second composition whereby a layer of uniform composition is grown during the second stage, and
(B) annealing the product of (A) to relieve said strain by causing dislocations, said annealing being carried out while the epilayer is in the form of mesas; whereby said structure is produced.

18. A method according to claim 17, wherein at beginning of step (A) the substrate is masked to prevent growth in the masked areas and the epilayer is grown onto the masked substrate wherein growth is inhibited in the masked regions so as to produce the said mesas.

19. A method according to claim 17, wherein step (A) comprises growing the epilayer over the whole of the surface of the substrate and thereafter dividing the epilayer to produce the mesas.

20. A method of preparing a semiconductor structure comprising a substrate and an epilayer crystallographically mismatched to said substrate; said structure being adapted for receiving material crystallographically mismatched to said substrate but crystallographically matched to said epilayer, wherein said process comprises:
(A) growing said epilayer onto the substrate in one stage wherein a constant composition of reactants is employed, the composition of said reactants being adapted to produce an epilayer of uniform composition which epilayer is crystallographically mismatched to said subsstrate and
(B) annealing the product of (A) to relieve said strain by causing dislocation, said annealing being carried out while the epilayer is in the form of mesas; whereby said structure is produced.

* * * * *